United States Patent [19]
Doitel et al.

[11] Patent Number: 5,944,422
[45] Date of Patent: Aug. 31, 1999

[54] APPARATUS FOR MEASURING THE PROCESSING TEMPERATURE OF WORKPIECES PARTICULARLY SEMICONDUCTOR WAFERS

[75] Inventors: Zahi Doitel, Givat Ela; Arie Hernik, Haifa; Ziv Atzmon, Zichrom Yaakov, all of Israel

[73] Assignee: A. G. Associates (Israel) Ltd., Migdal Haemek, Israel

[21] Appl. No.: 08/893,706

[22] Filed: Jul. 11, 1997

[51] Int. Cl.⁶ .................................. G01J 5/08; G01J 5/02
[52] U.S. Cl. .............................................. 374/131; 374/126
[58] Field of Search ..................... 374/126, 131, 374/128, 141; 118/666, 725, 729; 219/411, 121.12

[56] References Cited

U.S. PATENT DOCUMENTS

| | | | |
|---|---|---|---|
| 5,114,242 | 5/1992 | Gat et al. | 374/126 |
| 5,117,769 | 6/1992 | DeBoer et al. | 118/666 |
| 5,315,092 | 5/1994 | Takanashi et al. | 219/497 |
| 5,516,367 | 5/1996 | Lei et al. | 118/725 |
| 5,551,985 | 9/1996 | Brors et al. | 118/725 |
| 5,624,590 | 4/1997 | Fiory | 374/126 |
| 5,628,564 | 5/1997 | Nenyei et al. | 374/126 |
| 5,738,440 | 4/1998 | O'Neill et al. | 374/126 |
| 5,755,511 | 5/1998 | Peuse et al. | 374/126 |
| 5,823,681 | 10/1998 | Cabib et al. | 374/126 |

FOREIGN PATENT DOCUMENTS

| | | | |
|---|---|---|---|
| 0130834 | 6/1986 | Japan | 374/133 |
| 1436180 | 5/1976 | Switzerland | 374/126 |

*Primary Examiner*—Diego Gutierrez
*Assistant Examiner*—Quyen Doan
*Attorney, Agent, or Firm*—McDermott, Will & Emery

[57] ABSTRACT

Apparatus for measuring the temperature of workpieces, particularly semiconductor wafers, during their processing, including a head assembly having a head plate circumscribed by a raised rim for receiving the workpiece and for spacing it from the head plate to define an enclosed volume between the head plate, rim, and workpiece; a thermally-conductive member, e.g., an optical fiber, passing through the head assembly and having one end exposed to the enclosed volume such that it receives thermal radiation therefrom; and a thermal detector aligned with the opposite end of the thermally-conductive member for detecting the thermal radiation received by it from the enclosed volume and for converting same to an electrical signal representing a measurement of the temperature of the enclosed volume.

19 Claims, 4 Drawing Sheets

5,944,422

APPARATUS FOR MEASURING THE PROCESSING TEMPERATURE OF WORKPIECES PARTICULARLY SEMICONDUCTOR WAFERS

FIELD AND BACKGROUND OF THE INVENTION

The present invention relates to apparatus for measuring the processing temperature of workpieces. The invention is particularly useful for measuring the processing temperature of semiconductor wafers and is therefore described below with respect to this application, but it will be appreciated that the invention could be advantageously used also in other applications.

The in situ temperature measurement of semiconductor wafers during their processing may be of critical importance as certain processing operations must be performed at precisely controlled temperatures. One method of measuring the processing temperature is by the use of thermocouples in heat-conducting relation with the wafers. However, such thermocouples may interfere with the processing of the wafer, disturb the temperature distribution on the wafer, and/or hinder the handling of the wafer.

Optical methods for wafer temperature measurement are well known but their accuracy may be affected by environmental conditions, such as stray radiation or wafer emissivity during the thermal processing of the wafer.

OBJECTS AND BRIEF SUMMARY OF THE INVENTION

An object of the present invention is to provide temperature measuring apparatus having advantages in one or more of the above respects. Another object of the invention is to provide temperature measuring apparatus particularly useful for measuring the processing temperature of semiconductor wafers.

According to one aspect of the present invention, there is provided apparatus for measuring the processing temperature of workpieces comprising: a head assembly including a head plate circumscribed by a raised peripheral rim for supporting the workpiece spaced from the head plate to define an enclosed volume between the head plate, its peripheral rim, and the workpiece; a thermally-conductive member passing through the head assembly and having one end exposed to the enclosed volume such that it receives thermal radiation therefrom: a thermal detector aligned with the opposite end of the thermally-conductive member for detecting the thermal radiation received thereby from the enclosed volume, and for converting same to an electrical signal representing a measurement of the temperature of the enclosed volume and a reflective plate supported over the head plate to define a space between the reflective plate and the head plate, and a space between the reflective plate and a work piece when supported on the head assembly.

According to further features in the described preferred embodiment, the head assembly further includes a rotary drive for rotating the head assembly, the reflective plate, and the workpiece when supported on the head assembly. The reflective plate is of a size that its outer periphery is spaced from the rim. The head assembly further includes a gas inlet for circulating a gas through the enclosed volume.

The temperature measuring apparatus is particularly useful in applications wherein the head assembly is dimensioned to support a thin semiconductor wafer during its processing by the deposition thereon of various substances.

In such an application, the head assembly further includes a liner plate lining the underside of the head plate to protect it from such depositions.

As will be described more particularly below, such a temperature measurement apparatus can more precisely measure the true processing temperature of semiconductor wafers during their thermal processing. The head assembly creates an enclosed volume protected from external stray radiation sources. The reflective plate, which should have a highly reflective coating at measurement wavelengths, enables obtaining radiation levels very close to black body radiation, and therefore enables temperature measurement which is independent of wafer emissivity. Also, parts contamination by process gasses may be effectively eliminated by circulating a purging gas through the enclosed volume.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF A PREFERRED EMBODIMENT

Figure 1:
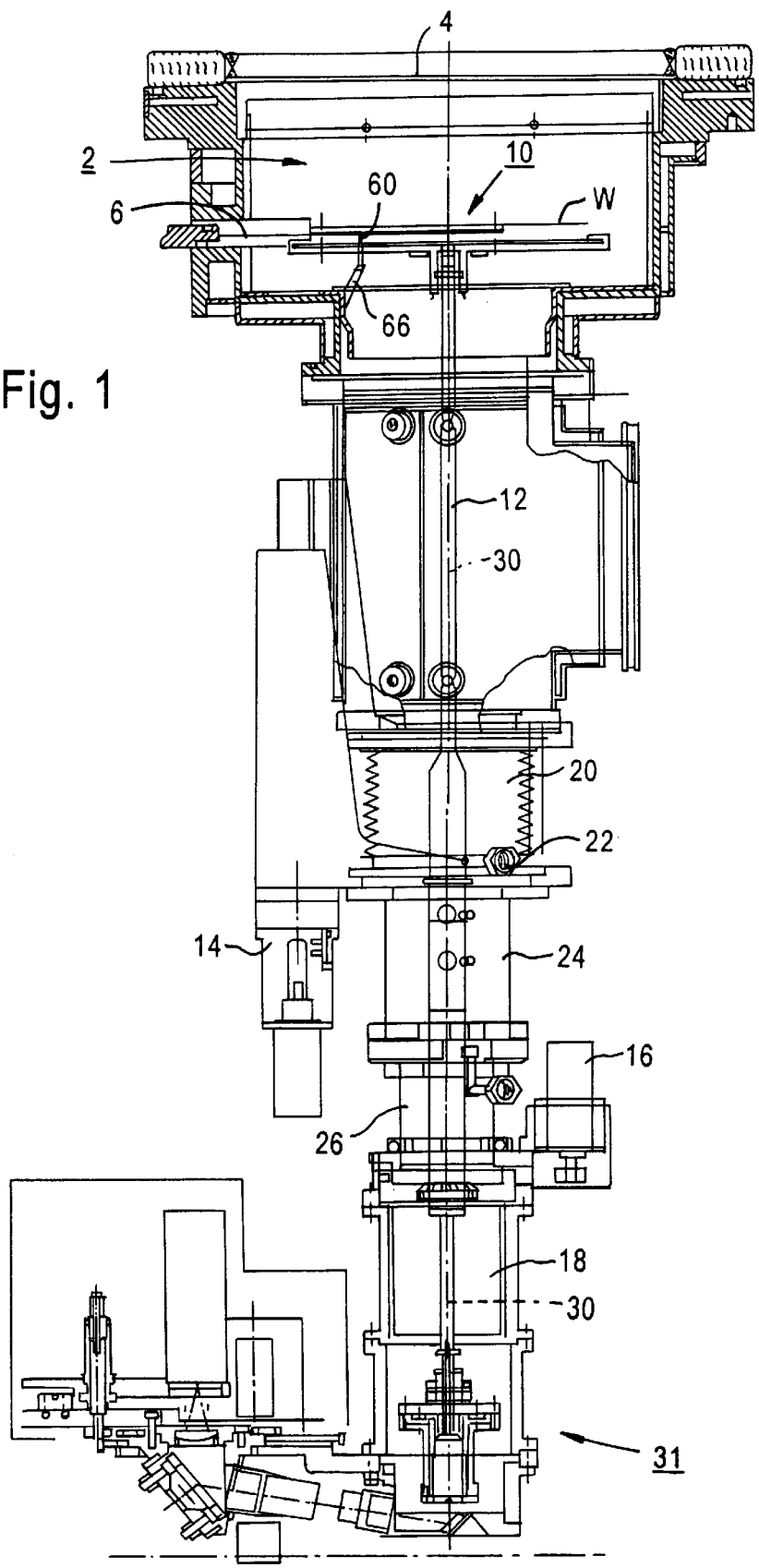
FIG. 1 illustrates a semiconductor wafer processing unit including one form of temperature measuring apparatus constructed in accordance with the present invention.

FIG. 1 illustrates a processing unit for processing wafers W one at a time. The illustrated unit includes a process chamber, generally designated 2, closed at its upper end by a quartz window 4. The wafers W are fed into the process chamber 2 one at a time by a robot arm 6. The process chamber 2 is heated by heaters (not shown) to deposit selected substances thereon by chemical vapor deposition (CVD).

Since such processing units are well known, further details of its construction and operation are not set forth herein. An example of such a processing unit is that included in the IPS-3 Cluster Tool Platform supplied by AG Associates, Fremont, Calif.

The wafers W fed into chamber 2 by robot arm 6, are supported within the chamber by a head assembly, generally designated 10, and more particularly described below with respect to FIGS. 2 and 3. Head assembly 10 is carried at the upper end of a vertical shaft 12 which may be driven both vertically in the axial direction by a vertical drive 14, and in the rotary direction by a rotary drive 16. Shaft 12 is water-cooled by a water supply unit 18 at the lower end of the shaft.

The axial movement of shaft 12 and the head assembly 10 carried at its upper end is accommodated by a bellows 20 which is also cooled by a bellows purge port 22. The interior of the chamber is sealed by vacuum seals 24, 26 at the lower end of the shaft 12.

The temperature within process chamber 2 is measured by a thermally-conductive member in the form of an optical fiber, generally designated 30, passing through shaft 12. As will be described below with respect to FIGS. 2 and 3, the upper end of optical fiber 30 is fixed to the head assembly 10 such that it receives thermal radiation during the processing of the wafer W supported on the head assembly, to provide an accurate measurement of the process temperature. The optical fiber extends for the complete length of shaft 12 and terminates adjacent to a thermal detector assembly, generally designated 31, at the lower end of the shaft. Detector assembly 31 detects the thermal radiation conducted through the optical fiber and converts it to an electrical signal representing a measurement of the process temperature of the wafer W within chamber 2, as described more particularly below with reference to FIG. 4.

Figure 2:
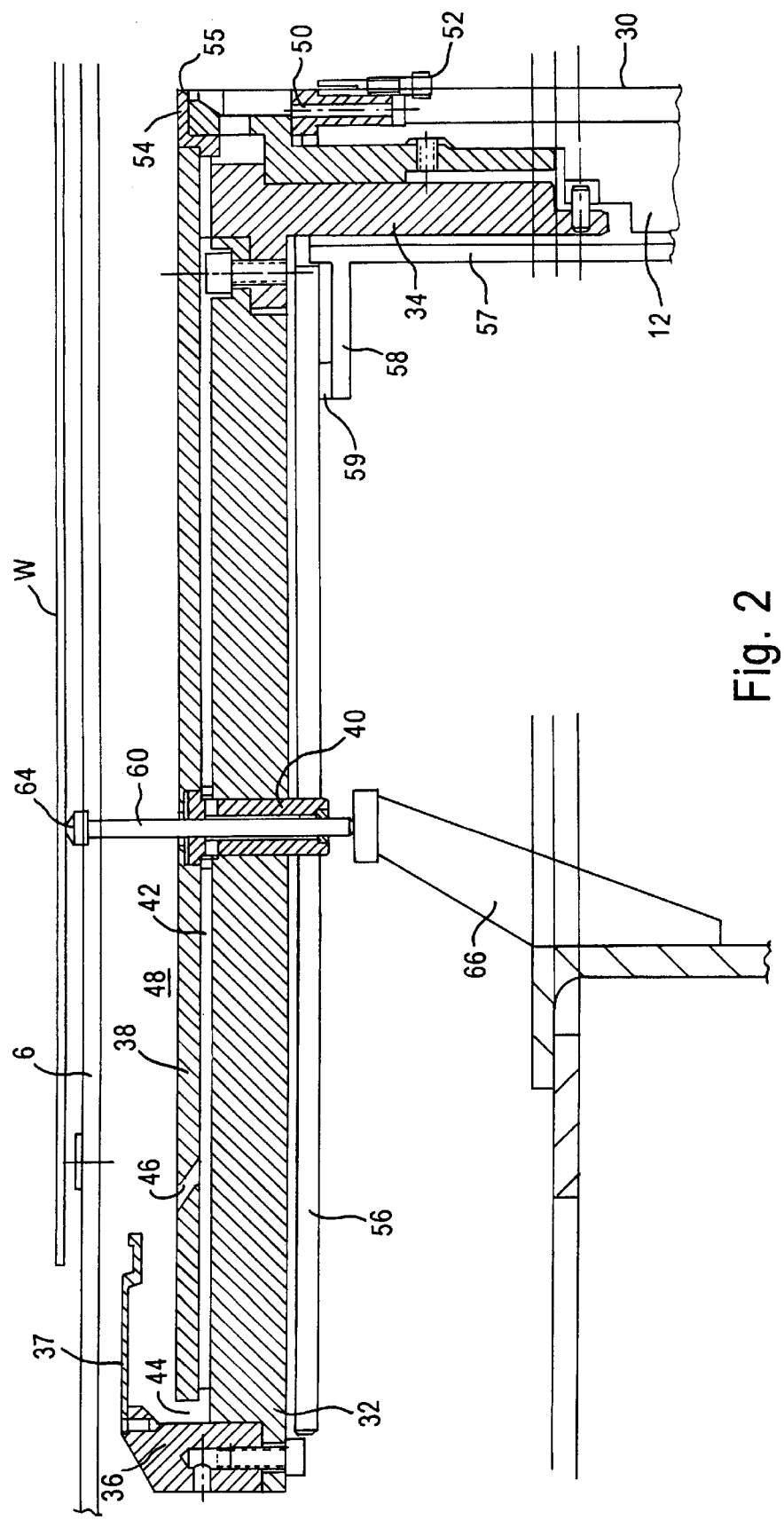
FIG. 2 is an enlarged fragmentary view illustrating the head assembly in the temperature measuring apparatus included in the processing unit of FIG. 1, the head assembly being shown in its retracted, loading/unloading position with respect to the wafers to be processed.
Figure 3:
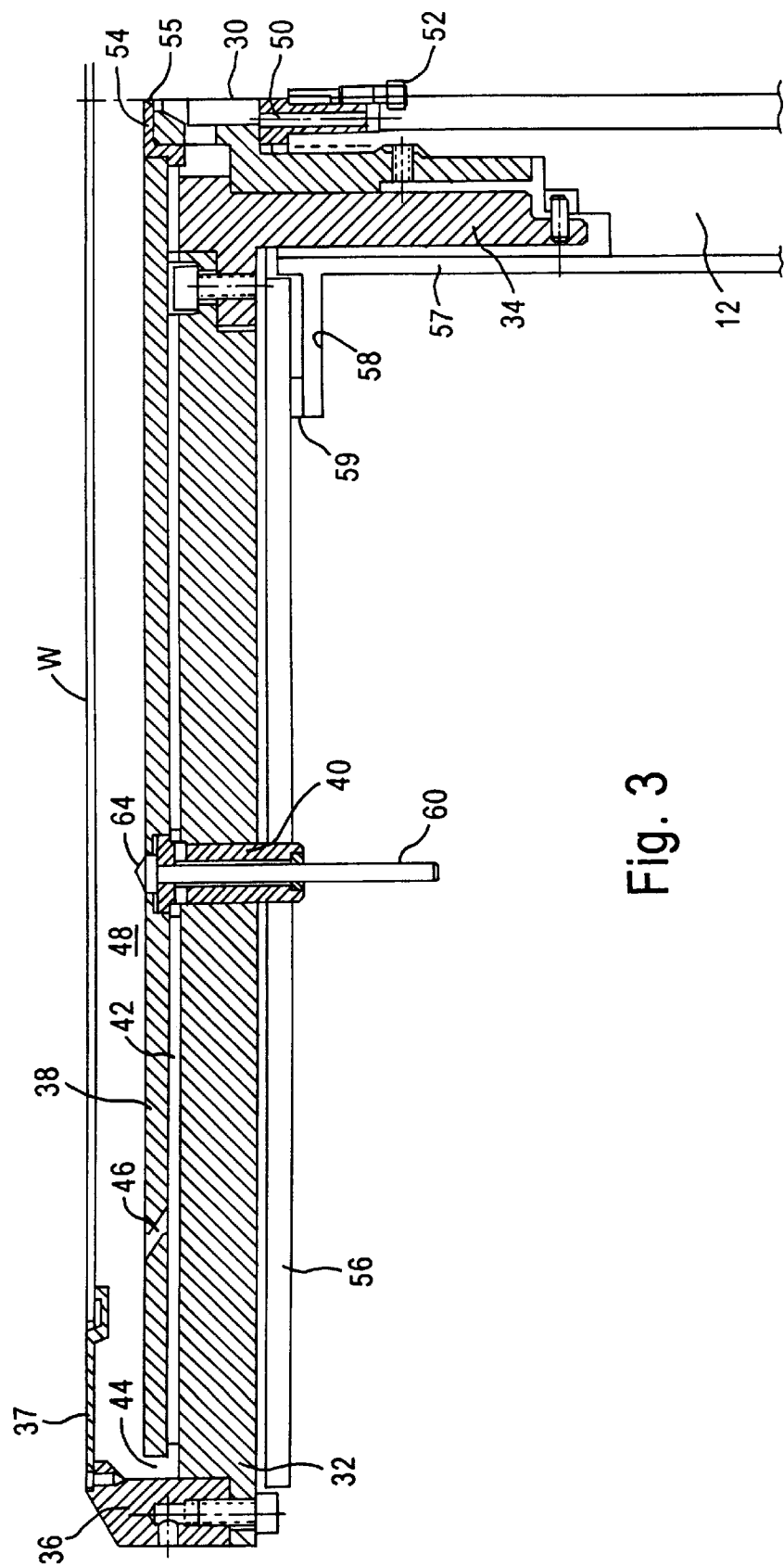
FIG. 3 is a view corresponding to that of FIG. 2 but showing the head assembly in its extended processing position when processing a wafer.

The head assembly 10, as more particularly illustrated in FIGS. 2 and 3, includes a circular head plate 32 fixed to shaft 12 by a head base 34, and an annular rim 36 fixed around the periphery of head plate 32. Annular rim 36 includes a supporting ring 37 raised above head plate 32 for supporting the wafer W spaced above the head plate.

It will be seen that when the wafer W is in processing position, supported on ring 37 of rim 36 as shown in FIG. 3, it forms with head plate 32, rim 36 and its supporting ring 37 of the head assembly 10, an enclosed volume between the wafer and head plate 32 of the head assembly. This enclosed volume is protected from external stray radiation. In addition, it enables a purging gas to be circulated through the interior of the head assembly to eliminate parts contamination by process gasses.

Head assembly 10 further includes a reflective plate 38 of circular configuration but of smaller diameter than head plate 32. Reflective plate 38 is supported to overlie head plate 32. A circular array of bushings 40 are press-fitted within holes formed in head plate 32 and head base 34, and have enlarged heads engageable with the underside of the reflective plate.

It will thus be seen that reflective plate 38 is spaced from head plate 32 by a space 42 extending over part of the complete undersurface of the reflective plate, and is also spaced from annular rim 36 of the head plate 32 by an annular space 44. Reflective plate 38 is further formed with a plurality of oblique holes 46 establishing communication between space 42 on the underside of the reflective plate, and space 48 on the upper side of the reflective plate. Spaces 42, 44, 48, and holes 46 define passageways for the flow of a purging gas to eliminate parts contaminated by the processing gasses. The purging gas may be inletted via an inlet port 50 at the upper end of shaft 12 and outletted in any suitable manner (not shown), into the interior of the process chamber 2 for removal via the exhaust for the processing gasses.

The optical fiber 30 is preferably a sapphire or quartz optical fiber, of 0.4 mm in diameter. It is disposed within a bore extending through shaft 12 having a diameter larger than that of the optical fiber such that the outer surface of the optical fiber defines a space around the optical fiber for gas flow. The upper end of the optical fiber is fixed to the upper end of shaft 12 by a fastener 52, and the lower end of the optical fiber may be fixed in a similar manner adjacent to and in alignment with the thermal detector assembly 31.

Head plate 32, base 34 and rim 36 are preferably all made of a heat-resistant ceramic or metal which is IR insulating. The wafer supporting ring 37 is preferably of graphite, or silicon-carbide coated graphite, to provide a slip-free heat-resistant support for the wafer W.

Reflective plate 38 may be of a heat-resistant metal or ceramic material. It is provided on its upper surface, facing the undersurface of the wafer W, with a coating which is highly reflective at the measurement wavelength detected by thermal detector assembly 31. This enables measurement of radiation levels very close to black body radiation, and therefore temperature measurements which are substantially independent of wafer emissivity during the thermal processing of the wafer.

The upper end of the optical fiber 30 is aligned with a central opening in the reflective plate 38 so that the outer tip of the optical fiber is exposed to receive the thermal radiation within the enclosed volume defined by head plate 32, reflective plate 38, rim 36, its supporting ring 37 and the wafer when supported on the ring 37. As shown in FIGS. 2 and 3, reflective plate 38 is formed with a central opening of much larger diameter than that of the optical fiber 30 and aligned with it. This opening is occupied by a reflective cup 54 having a smaller-diameter opening 55 only slightly larger than the diameter of the optical fiber. Such an arrangement facilitates aligning the optical fiber with the opening through the reflective plate 38 to receive the thermal radiation within the enclosed volume. Preferably, the upper end of the optical fiber projects for a short distance, e.g., 0.5 mm, through opening 55 into space 48.

The illustrated head assembly 10 further includes a liner plate 56 lining the underside of the head plate 32 to protect it from deposition of the substances which are deposited on the wafer W in the process chamber 2. Shaft 12 is enclosed by a tubular liner 57 for the same purpose. Its upper end is formed with an annular flange 58 underlying liner plate 56 and connected to it by an annular bead 59. Liner elements 56–59 are of a suitable heat-resistant material, preferably quartz.

The illustrated head assembly 10 further includes a plurality of pins 60 used during the loading and unloading of a wafer W. Pins 60 are freely movable through the previously-mentioned bushings 40 press-fitted in openings in the reflective plate 38, and head plate 32, and also in the liner plate 56. The upper ends of pins 60 are formed with heads engageable with the underside of a wafer W. The lower ends of the pins are engageable with stops 66 fixed within the process chamber 2.

Head assembly 10 is moved by shaft 12 either to a retracted position (FIG. 2) for loading/unloading the wafer W, or to an extended position (FIG. 3) for processing the wafer within the process chamber 2. Thus, as shown in FIG. 2, when the head assembly is in its retracted position, the lower ends of pins 60 engage stops 66 so that the upper ends 64 of the pins may receive the wafer W when the wafer is being loaded, or may space the wafer from the ring 37 in order to unload the wafer. When the head assembly is in its projected position as shown in FIG. 3, pins 60 disengage from the fixed stops 66 and thereby move downwardly by gravity within the head assembly and out of contact with the wafer W, permitting the wafer to be supported by the ring 37 during the processing of the wafer.

Figure 4:
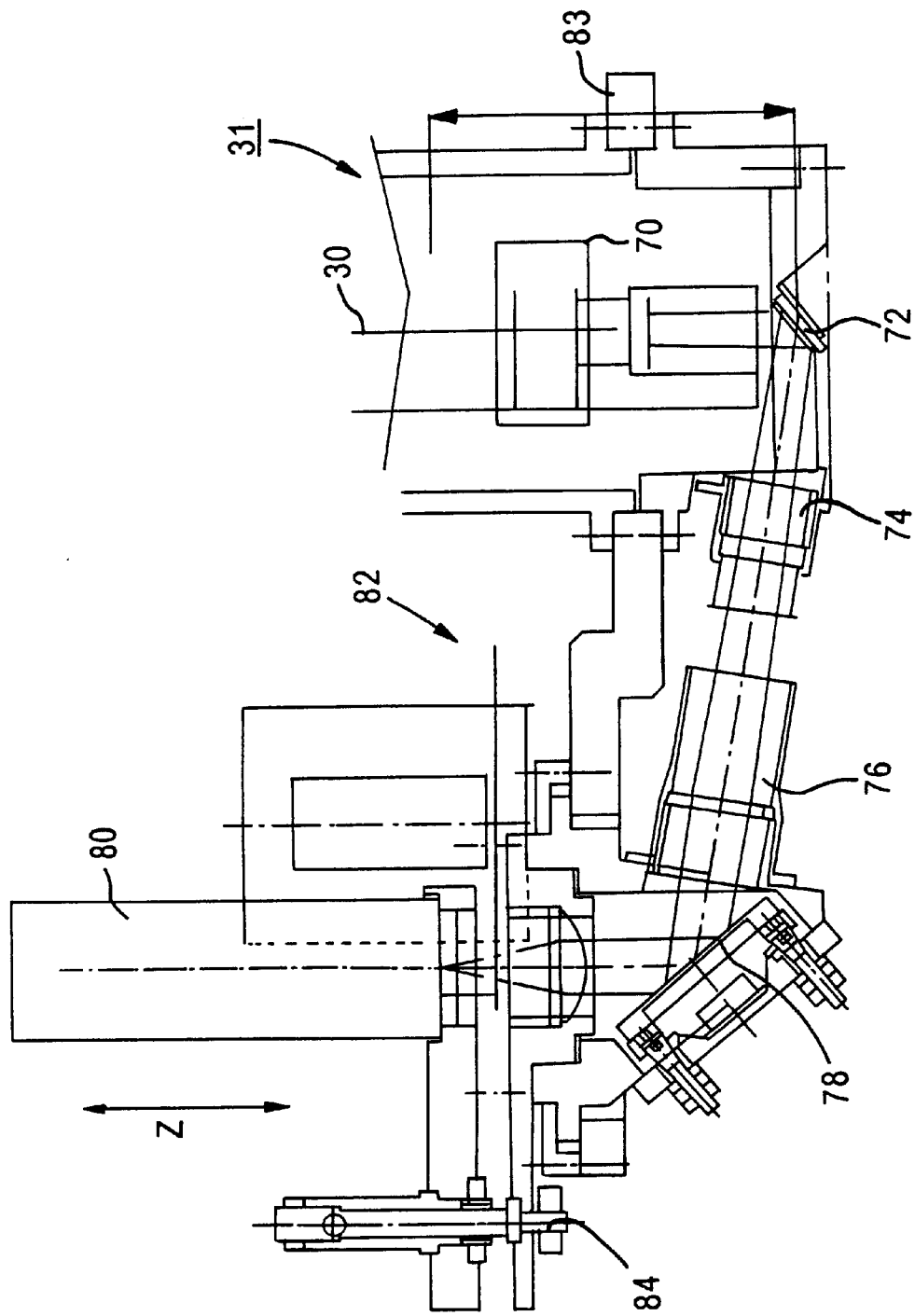
FIG. 4 is a diagram illustrating the optical-mechanical layout of the thermal detector included in the temperature measuring apparatus of FIG. 1.

FIG. 4 schematically illustrates the construction of the detector assembly 31 aligned with the lower end of the optical fiber 30 for detecting the thermal radiation conducted by the optical fiber and for converting it to an electrical signal representing a measurement of the processing temperature of the wafer W. As shown in FIG. 4, the lower end of the optical fiber 30 is aligned with an optical objective assembly 70 which collimates the thermal radiation emitted from the fiber. A mirror 72 reflects the radiation through a filter 74, a collimating lens assembly 76, and another mirror 78, to an optical sensor 80 via a chopper 82. Filter 74 is selected to pass only the measured IR radiation, namely of a wavelength of 950±100 nm ($10^{-9}$M). Optical sensor 80 is preferably a cooled silicon detector head, e.g., Model 71903 or 71904 supplied by Oriel Instruments of Stratford, Conn. The foregoing optical components may be adjusted for alignment purposes by adjusting devices schematically shown at 84.

OPERATION

The operation of the illustrated apparatus will be apparent from the above description. Thus, in order to introduce a wafer W into the process chamber 2, the head assembly 10 is moved by shaft 12 to its retracted position, illustrated in FIG. 2. In this position, the lower ends of pins 60 engage the fixed stops 66, so that the upper ends 64 of the pins are raised to receive the wafer W as it is introduced into the reaction chamber 2 by robot arm 6. After the wafer W has been thus applied to the raised pins 60, the robot arm 6 is retracted from the chamber, and the head assembly 10 is then moved by its shaft 12 to its projected position as shown in FIG. 3. When the head assembly is so moved, the pins 60 are no longer engaged with the fixed stops 66, so that the pins automatically retract, first under the weight of the wafer W until the wafer is supported on rim 37, and then under their own weight to their retracted positions shown in FIG. 3 spaced from the undersurface of the wafer.

The wafer W is now in position, supported by rim 37, for processing in the process chamber 2. It will be seen that when the wafer is in this processing position, it creates within head assembly 10 an enclosed volume protected from external stray radiation. This enclosed volume also enables purging gas to be circulated to eliminate parts contamination by process gasses. Such purging gas may be circulated via inlet 50 and through spaces 42, 46, 44 and 48, to be outletted via suitable vents (not shown) into the process chamber 2 for evacuation via the process gas outlet.

The wafer W supported by the head assembly 10 may thus be processed in process chamber 2, e.g., according to one of the known chemical vapor deposition (CVD) processes. Various processes require heating temperatures generally within the range of 400–1100° C., with a tolerance of±5° C. The process temperature is detected by the optical fiber 30, which receives thermal radiation from the head assembly and conducts it to the thermal detector assembly 31. Detector assembly 31 conducts the radiation via mirror 72, filter 74, lens assembly 76, mirror 78 and chopper 82 to the optical detector 80 (FIG. 4), which converts the radiation to an electrical signal representing a measurement of the temperature within the head assembly.

The processing of the wafer may involve rotation of the wafer, which can be effected by the rotary drive 16 (FIG. 1) rotating shaft 12.

After the processing of the wafer has been completed, shaft 12 is again retracted to the position illustrated in FIG. 2, wherein pins 60 of the head assembly 10 engage the underside of the wafer W and raise it out of contact with the supporting ring 37, permitting the robot arm 6 to be introduced into the chamber under the wafer and to remove the wafer.

While the invention has been described with respect to one preferred embodiment, it will be appreciated that this is set forth merely for purposes of example and that the invention may be used in many other applications requiring accurate temperature measurement. For example, the invention may be used for measuring the processing temperature of other articles than wafers, e.g., parts to be heat-treated. Many other variations, modification and applications of the invention will be apparent.

What is claimed is:

1. Apparatus for measuring the processing temperature of workpieces comprising:
   a head assembly including a head plate circumscribed by a raised peripheral rim for supporting a workpiece spaced from the head plate to define an enclosed volume between the head plate, its peripheral rim, and the workpiece;
   a thermally-conductive member passing through said head assembly and having one end exposed to said enclosed volume such that it receives thermal radiation therefrom;
   a thermal detector aligned with the opposite end of the thermally-conductive member for detecting the thermal radiation received thereby from said enclosed volume, and for converting same to an electrical signal representing a measurement of the temperature of said workpiece;
   and a reflective plate supported over said head plate to define a space between the reflective plate and the head plate, and a space between the reflective plate and a work piece when supported on the head assembly.

2. The apparatus according to claim 1, wherein said head assembly further includes a rotary drive for rotating the head assembly, the reflective plate, and the workpiece when supported on the head assembly.

3. The apparatus according to claim 1, wherein said reflective plate is of a size such that the outer periphery of said reflective plate is spaced from said rim.

4. The apparatus according to claim 1, wherein the head assembly further includes a gas inlet for circulating gas through said enclosed volume.

5. The apparatus according to claim 4, wherein said reflective plate is formed with openings therethrough to facilitate the gas circulation.

6. The apparatus according to claim 1, wherein said thermally-conductive member is mounted to the head assembly such as to define a space around the outer surface of the thermally-conductive member.

7. The apparatus according to claim 1, wherein said thermally-conductive member is an optical fiber, and said reflective plate is formed with an opening of much larger diameter than that of said optical fiber and aligned with the optical fiber; said large-diameter opening being occupied by a reflective cup having a smaller-diameter opening only slighly larger than the diameter of the optical fiber.

8. The apparatus according to claim 1, wherein said head assembly further includes a shaft formed with a bore for receiving said thermally-conductive member, and an axial drive for driving said shaft and said head assembly to a working position, or to a loading/unloading position for the workpiece.

9. The apparatus according to claim 8, wherein said head assembly further includes a plurality of pins movable through holes in said head plate; said pins including upper ends engageable with the underside of a workpiece and lower ends engageable with fixed stops, such that: moving said head assembly downwardly causes the lower ends of said pins to engage said stops and the upper ends of the pins to engage the underside of the workpiece, for loading or unloading a workpiece; whereas moving said head assembly upwardly causes the lower ends of said pins to disengage from said stops, and the upper ends of said pins to move by gravity away from the workpiece, for processing the workpiece.

10. The apparatus according to claim 1, wherein said head assembly is dimensioned to support a thin semiconductor wafer work piece during processing thereof by deposition of various substances; said head assembly further including a liner plate lining the underside of said head plate to protect same from deposition of said substances.

11. Apparatus for measuring the processing temperature of semiconductor wafers, comprising:

a head assembly including a head plate circumscribed by a raised peripheral rim for supporting a semiconductor wafer spaced from the head plate to define an enclosed volume between the head plate, peripheral rim, and the wafer when supported thereon;

a reflective plate spaced above the head plate and spaced below a wafer when supported on the head assembly to define spaces which are included within said enclosed volume;

a thermally-conductive optical fiber passing through said head plate and reflective plate, and having one end located within said enclosed volume such that it receives thermal radiation within the enclosed volume;

and a thermal detector aligned with the opposite end of the optical fiber for detecting the thermal radiation received by said optical fiber and for converting same to an electrical signal representing a measurement of the temperature of said enclosed volume.

12. The apparatus according to claim 11, wherein the head assembly further includes a gas inlet for circulating gas through said enclosed volume.

13. The apparatus according to claim 11, wherein the outer periphery of said reflective plate is spaced from said rim, and said reflective plate is formed with openings therethrough to facilitate the gas circulation.

14. The apparatus according to claim 11, wherein said optical fiber is mounted to the head assembly such that the outer surface of the optical fiber is spaced from the adjacent surface of the head assembly to define a space around the optical fiber for gas flow.

15. The apparatus according to claim 11, wherein said reflective plate is formed with an opening of much larger diameter than that of said optical fiber and aligned with the optical fiber; said large-diameter opening being occupied by a reflective cup having a smaller-diameter opening only slighly larger than the diameter of the optical fiber.

16. The apparatus according to claim 11, wherein said head assembly further includes a shaft formed with a bore for receiving said optical fiber, and an axial drive for driving said head assembly to a working position or to a loading/unloading position for a semiconductor wafer.

17. The apparatus according to claim 16, wherein said head assembly further includes a plurality of pins movable through holes in said reflective plate and head plate; said pins including upper ends engageable with the underside of a semiconductor wafer, and lower ends engageable with fixed stops, such that: moving said head assembly downwardly causes the lower ends of said pins to engage said stops and the upper ends of the pins to engage the underside of a semiconductor wafer, for loading or unloading a semiconductor wafer; whereas moving the head assembly upwardly causes the lower ends of said pins to disengage from said stops, and the upper ends of said pins to move by gravity away from the semiconductor wafer for processing the semiconductor wafer.

18. The apparatus according to claim 16, wherein said head assembly further includes a rotary drive for rotating the head assembly and a semiconductor wafer when supported thereon.

19. The apparatus according to claim 11, wherein said head assembly further includes a liner plate lining the underside of said head plate to protect same from deposition of substances during the processing of a semiconductor wafer when supported on the head assembly.

* * * * *